US007999586B2

(12) United States Patent
Lee et al.

(10) Patent No.: US 7,999,586 B2
(45) Date of Patent: Aug. 16, 2011

(54) DIGITAL PHASE LOCKED LOOP WITH CLOSED LOOP LINEARIZATION TECHNIQUE

(75) Inventors: Hyung-Jin Lee, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/646,953

(22) Filed: Dec. 23, 2009

(65) Prior Publication Data
US 2011/0148488 A1 Jun. 23, 2011

(51) Int. Cl.
*H03L 7/06* (2006.01)
(52) U.S. Cl. .................. 327/159; 327/149; 327/158
(58) Field of Classification Search .......... 327/149, 327/158, 159
See application file for complete search history.

(56) References Cited

U.S. PATENT DOCUMENTS

| 5,412,349 A | 5/1995 | Young et al. | |
|---|---|---|---|
| 5,446,867 A | 8/1995 | Young et al. | |
| 6,670,833 B2 | 12/2003 | Kurd et al. | |
| 6,813,111 B2* | 11/2004 | Bhakta et al. | 360/77.02 |
| 7,272,175 B2* | 9/2007 | Kim et al. | 375/226 |
| 7,327,174 B2 | 2/2008 | Fan et al. | |
| 7,619,452 B2 | 11/2009 | Lee et al. | |
| 7,738,600 B2* | 6/2010 | Kim et al. | 375/326 |
| 7,777,576 B2* | 8/2010 | Waheed et al. | 331/17 |
| 7,786,913 B2* | 8/2010 | Waheed et al. | 341/143 |
| 7,920,081 B2* | 4/2011 | Waheed et al. | 341/118 |
| 2003/0053564 A1* | 3/2003 | Kim et al. | 375/326 |
| 2008/0253492 A1* | 10/2008 | Wang et al. | 375/376 |
| 2008/0315928 A1* | 12/2008 | Waheed et al. | 327/159 |
| 2009/0276542 A1* | 11/2009 | Aweya et al. | 709/248 |
| 2009/0325494 A1* | 12/2009 | Staszewski et al. | 455/43 |
| 2010/0283654 A1* | 11/2010 | Waheed et al. | 341/166 |
| 2011/0063003 A1* | 3/2011 | Friedman et al. | 327/157 |

OTHER PUBLICATIONS

Da Dalt, Nicola, "A Design-Oriented Study of the Nonlinear Dynamics of Digital Bang-Bang PLLs", *IEEE Transactions on Circuits and Systems—I: Regular Papers*, vol. 52, No. 1, (Jan. 2005), 21-31.
Rylyakov, A., et al., "Bang-Bang Digital PLLs at 11 and 20GHz with sub-200fs Integrated Jitter for High-Speed Serial Communiction Applications", *IEEE International Solid-State Circuits Conference*, ISSCC 2009/Session 5/Potpourri: PLL, Optical, DSL/5.3, (2009), 94.

(Continued)

*Primary Examiner* — Lincoln Donovan
*Assistant Examiner* — Adam D Houston
(74) *Attorney, Agent, or Firm* — Blakely, Sokoloff, Taylor & Zafman LLP

(57) ABSTRACT

Apparatuses, systems, and a method for providing a digital phase-locked loop (PLL) are described. In one embodiment, an apparatus includes an integration-mode phase frequency detector (PFD) that compares a phase and frequency of a reference clock signal to a phase and frequency of a generated feedback clock signal and generates a digitized output signal. A digital loop filter (DLF) receives the digitized output signal and applies a linearization technique to the digitized output signal. The DLF includes a derivative gain unit of a derivative path, a proportional gain unit of a proportional path, and an integral gain unit of an integral path. The derivative path provides a direct proportional feedback loop path to the integration-mode PFD by compensating the integration of an integrator that receives output signals from the paths. The integration-mode PFD can be implemented with a hybrid circuit or a substantially digital circuit.

15 Claims, 13 Drawing Sheets

OTHER PUBLICATIONS

Staszewski, Robert B., et al., "All-Digital TX Frequency Synthesizer and Discrete-Time Receiver for Bluetooth Radio in 130-nm CMOS", *IEEE Journal of Solid-State Circuits*, vol. 39, No. 12, (Dec. 2004), 2278-2291.

* cited by examiner

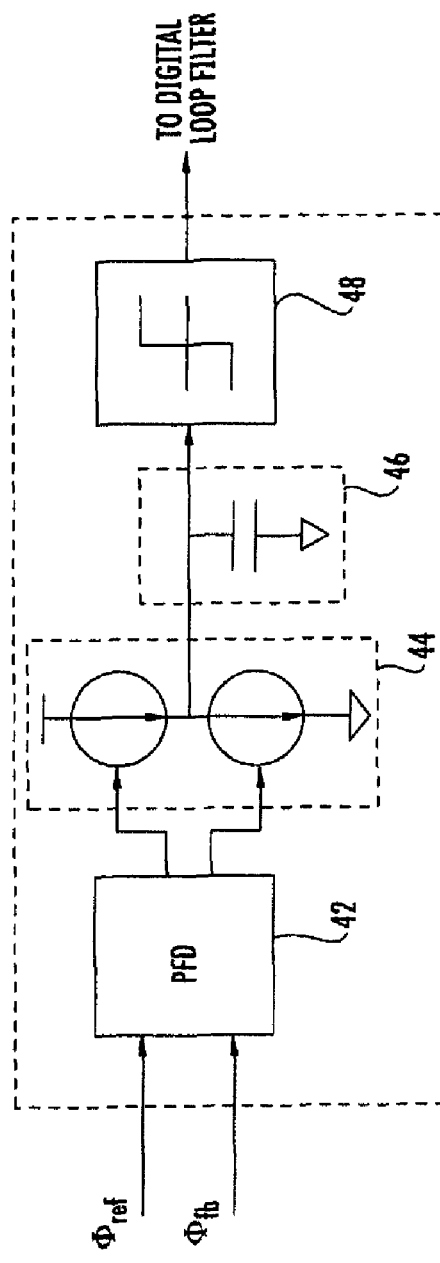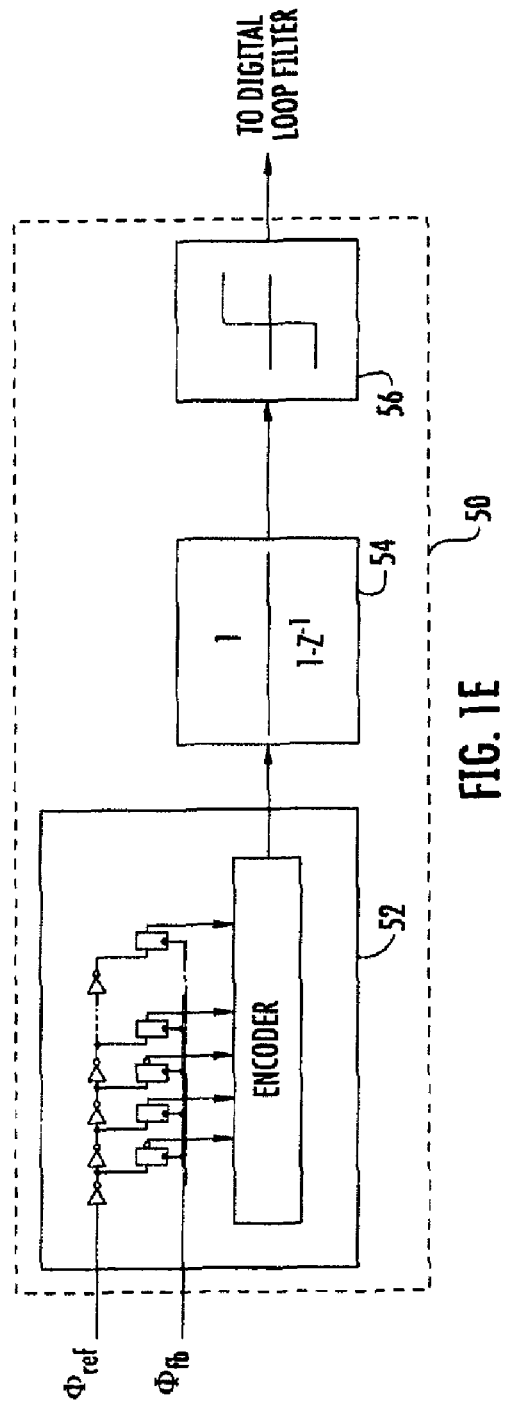

US 7,999,586 B2

DIGITAL PHASE LOCKED LOOP WITH CLOSED LOOP LINEARIZATION TECHNIQUE

TECHNICAL FIELD

Embodiments of the inventions relate to a digital phase locked loop with a closed loop linearization technique.

BACKGROUND ART

Digital phase-locked loops (PLL) require a form of time-to-digital conversion, which produces digitized phase error information. Analog PLLs require a phase and frequency detector (PFD). However, the time-to-digital convertor (TDC) is a circuit which requires accurate delay definition and resolution and such a circuit when implemented in an integrated circuit suffers from process variation and power supply noise which degrades the accuracy of the time to digital conversion. In addition, the TDC is a non-linear circuit and produces quantization noise due to its finite discrete delay resolution unlike the continuous phase resolution of PFDs. The TDC in a digital PLL produces non-linearities which degrade the system performance by producing frequency spurs in the output signal. The TDC therefore causes limitations on the PLL phase noise performance from finite limit cycles and excessive quantization noise.

One way to achieve higher linearity is by increasing the resolution of the TDC. A high resolution multi-bit TDC is widely used as it explicitly improves the linearity while reducing its quantization noise. However, a multi-bit TDC also increases circuit complexity and it often relies on accurate and precise circuit propagation delay units (i.e., least significant bits (LSB) of resolution) which in a practical circuit implementation is susceptible to process variations and power supply noise (e.g., 5 bit TDC has 32 delay stages). Another approach is to dither the reference clock in time. This dithering results in a higher input noise contribution from the reference clock resulting in high phase noise. Another approach is simply to ignore the non-linear effect, and assume the non-linear TDC as a linear TDC with quantization noise injected. However, this often prevents accurate system dynamic analysis and increases the sensitivity to other system non-linearities such as loop delay.

BRIEF DESCRIPTION OF THE DRAWINGS

The various embodiments of the present invention are illustrated by way of example, and not by way of limitation, in the figures of the accompanying drawings and in which:

FIG. 1D illustrates a hybrid implementation of an integration-mode PFD (10) in accordance with one embodiment.

FIG. 1E illustrates a substantially digital implementation of an integration-mode PFD (1) in accordance with one embodiment.

DETAILED DESCRIPTION

Figure 1A:
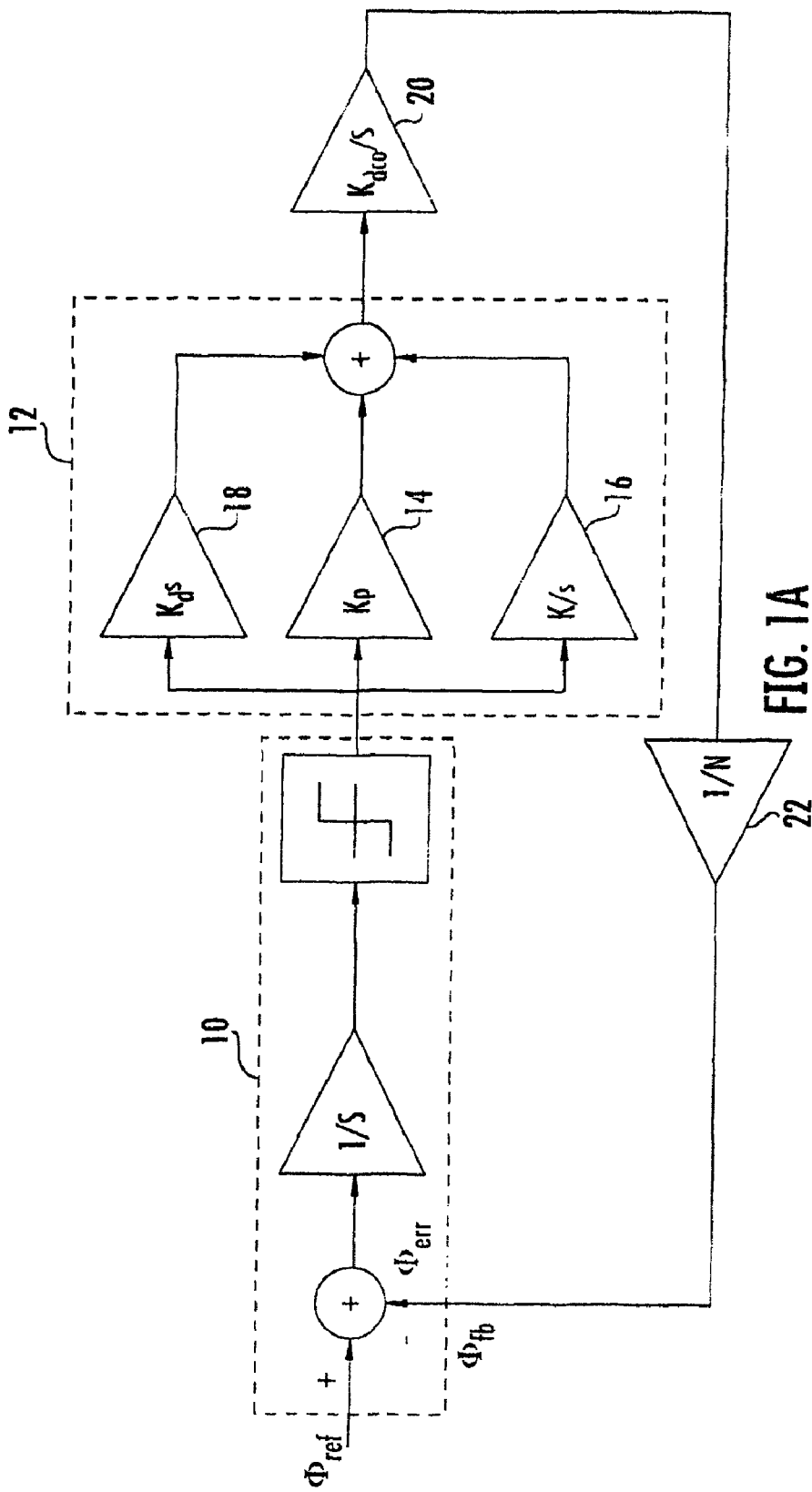
FIG. 1A illustrates a digital PLL architecture in accordance with one embodiment.

Apparatuses, systems, and a method for providing a digital phase-locked loop (PLL) are described. In one embodiment, an apparatus includes an integration-mode phase frequency detector (PFD) that compares a phase and a frequency of a reference clock signal to a phase and frequency of a generated feedback clock signal and generates a digitized output signal. A digital loop filter (DLF) receives the digitized output signal and applies a linearization technique to the digitized output signal. The DLF includes a derivative gain unit of a derivative path, a proportional gain unit of a proportional path, and an integral gain unit of an integral path. The derivative path provides a direct proportional feedback loop path to the integration-mode PFD by compensating the integration of an integrator that receives output signals from the paths. Therefore, the derivative path forms a complete sigma-delta loop.

In another embodiment, an apparatus includes a digital phase frequency detector (D-PFD) that compares a phase and frequency of a reference clock signal to a phase and frequency of a generated feedback clock signal and generates a digitized output signal. The D-PFD output signal is non-linear. A digital loop filter (DLF) receives the digitized output signal and applies a linearization technique to the digitized output signal. The DLF includes a proportional path, a first integral path, and a second integral path. The outputs of the respective paths are added to form control information. A digitally controlled oscillator (DCO) receives the control information from the DLF, adjusts a frequency of the DCO, and generates an output signal of the DCO. A divider receives the output signal and generates the feedback clock signal.

In an embodiment, a design described in this present disclosure enables the realization of a fully all-digital PLL (AD-PLL) with a digital PFD (e.g., Bang-Bang PFD (BBPFD)) excluding the usage of multi-bit TDCs which have dependencies of analog characteristics such as precise signal delay line. A unique linearization technique uses the inherent quantization noise produced by the BBPFD in order for the ADPLL to achieve reliable system dynamics, which are robust to any system sensitivity to signal loop delay. Since the linearization technique does not require any extra randomization technique and it even pushes the BBPFD quantization noise into a high frequency range, which is typically out of band, it is possible to realize a very low jitter (higher performance PLL) all-digital PLL without a limit-cycle problem unlike the typical digital PLLs. The ADPLL has no time-to-digital converter circuitry and has no dependencies or substantially no dependencies of analog characteristics.

In the following description, numerous specific details such as logic implementations, sizes and names of signals and buses, types and interrelationships of system components, and logic partitioning/integration choices are set forth in order to provide a more thorough understanding. It will be appreciated, however, by one skilled in the art that the invention may be practiced without such specific details. In other instances, control structures and gate level circuits have not been shown in detail to avoid obscuring the invention. Those of ordinary skill in the art, with the included descriptions, will be able to implement appropriate logic circuits without undue experimentation.

In the following description, certain terminology is used to describe features of the invention. For example, the term "logic" is representative of hardware and/or software configured to perform one or more functions. For instance, examples of "hardware" include, but are not limited or restricted to, an integrated circuit, a finite state machine or even combinatorial logic. The integrated circuit may take the form of a processor such as a microprocessor, application specific integrated circuit, a digital signal processor, a microcontroller, or the like. The interconnect between chips each could be point-to-point or each could be in a multi-drop arrangement, or some could be point-to-point while others are a multi-drop arrangement.

In one implementation of digital phase-locked loop, direct digitization of phase information, such as with a multi-bit TDC, produces not only non-linearity, but also flat white quantization noise injection, and therefore degrades phase noise performance. FIG. 1A illustrates a digital PLL architecture in accordance with one embodiment. An integration-mode PFD 10 mitigates the performance degradation from non-linearity and unshaped quantization noise in the digital PLL with the multi-bit TDC.

Figure 1B:
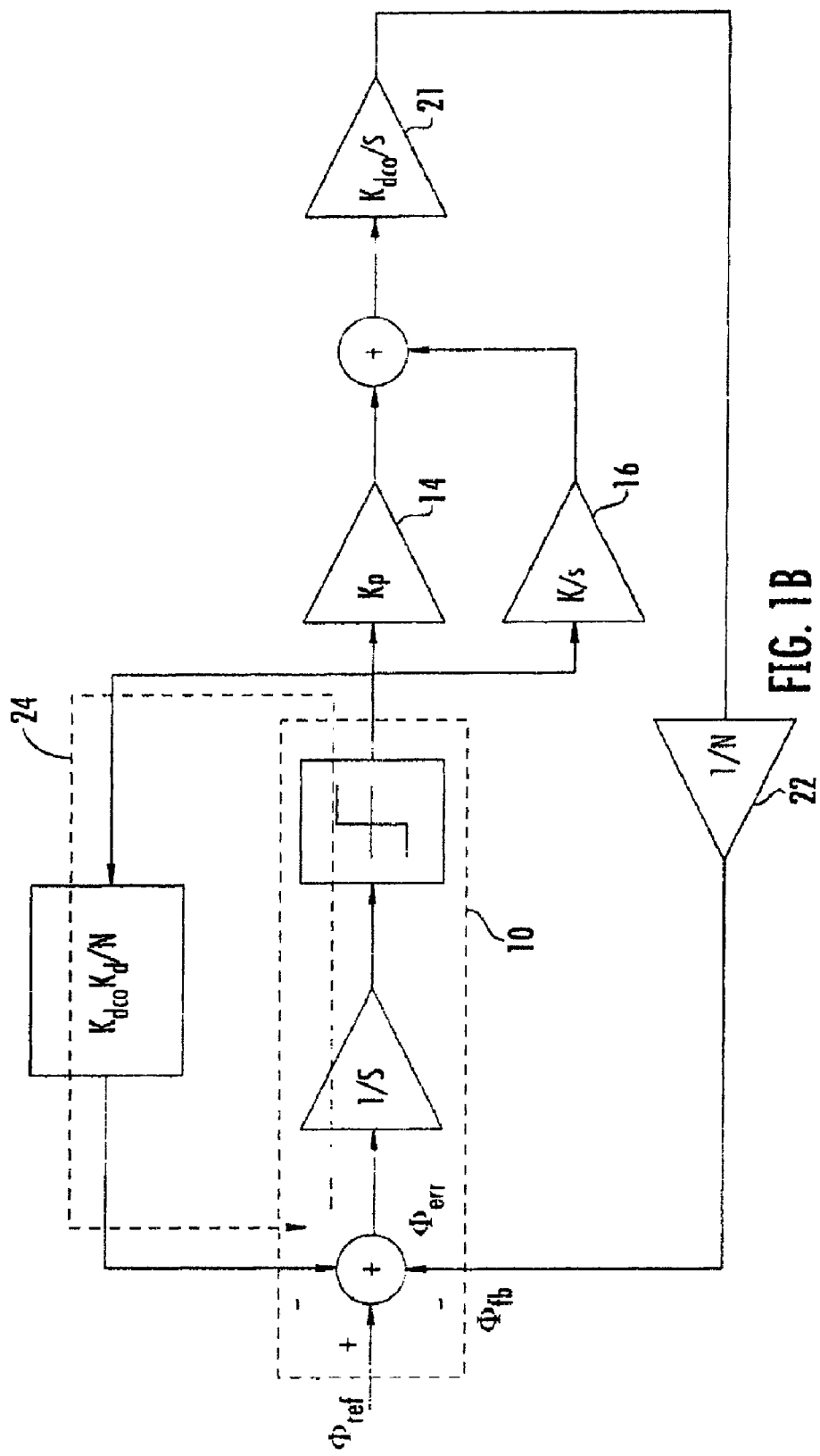
FIG. 1B illustrates a complete sigma-delta loop in accordance with an embodiment.

The digital loop filter 12 includes a proportional path 14, an integral path 16, and a derivative path 18. The derivative path 18 provides a direct proportional feedback loop path to the integration-mode PFD 10 by compensating the integration of the integrator, $K_{DCO/S}$ 20. Therefore, the derivative path forms a complete sigma-delta loop 24 as shown in FIG. 1B in accordance with an embodiment.

Figure 1C:
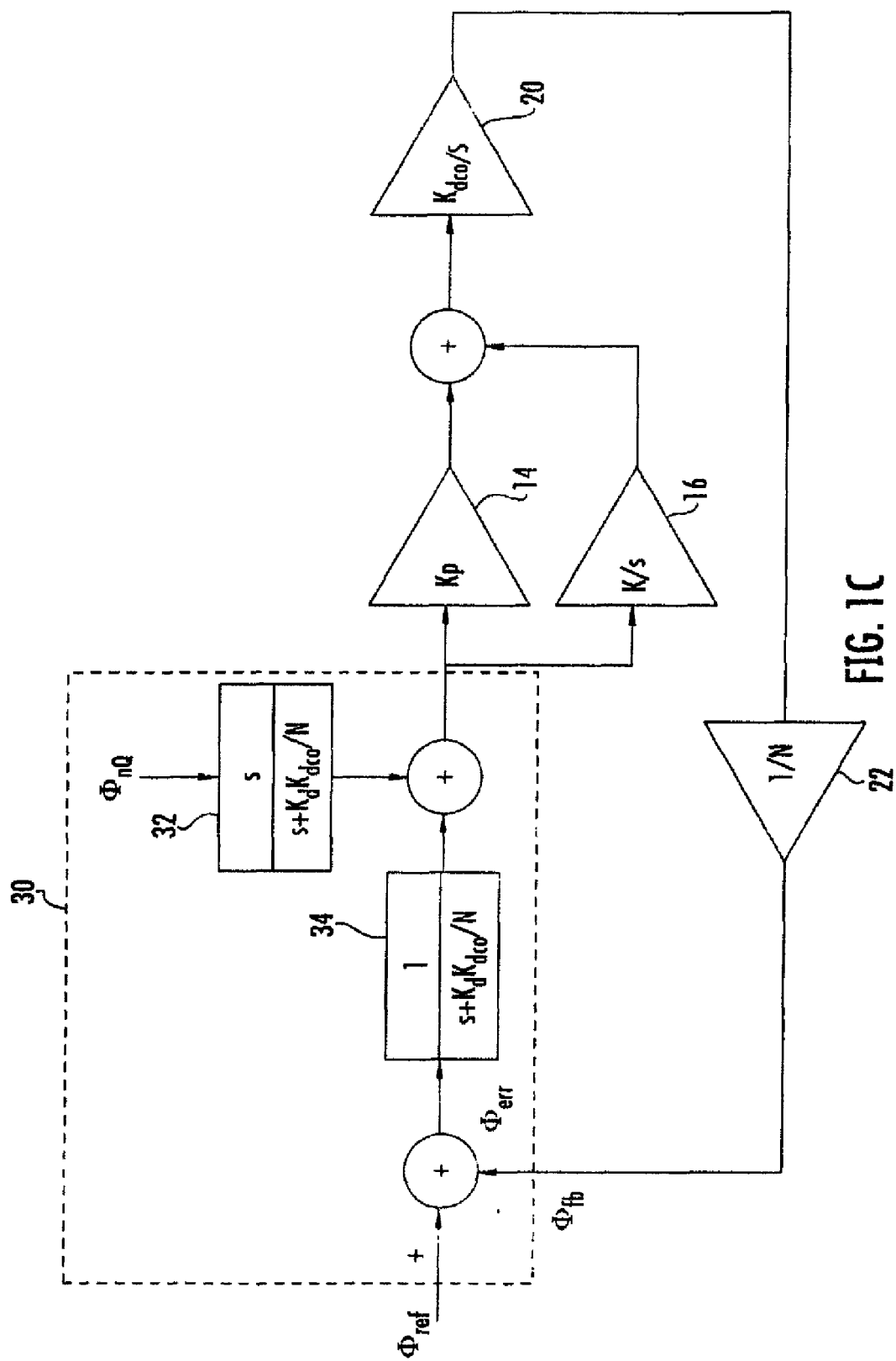
FIG. 1C illustrates the equivalent linear representation of the digital PLL architecture shown in FIG. 1A in accordance with one embodiment.

FIG. 1C illustrates the equivalent linear representation of the digital PLL architecture shown in FIG. 1A in accordance with one embodiment. The block 30 represents a linear decomposition of the integration-mode PFD 10. The linear model of the integration-mode PFD 30 shows the low-pass filtering response to phase error 34 along with the high-pass filtering response to quantization noise 32, which pushes the quantization noise to a high-frequency range, thus reducing the in-band phase noise.

The implementation of the integration-mode PFD could be analog-digital hybrid circuit 40 as illustrated in FIG. 1D in accordance with one embodiment. Alternatively, the integration-mode PFD could be a substantially digital implementation with conventional multi-bit TDC 50 as shown in FIG. 1E in accordance with another embodiment.

The hybrid implementation with circuit 40 includes a continuous time PFD 42, charge-pump 44, capacitor 46 and a digitizer 48, which is a BangBang PFD in this case. The hybrid implementation with circuit 40 relaxes accuracy of analog circuitry, since the digitizer, BangBang PFD in this case, is able to correct the non-linearity that arises in the analog circuits, which are the continuous time PFD, the charge-pump and the lump capacitor, in combination with the derivative path 18 in the digital loop filter 12.

The substantially digital implementation with circuit 50 includes a multi-bit TDC 52, discrete time accumulator 54, and a digitizer 56. The substantially digital implementation with circuit 50 can simplify the implementation by avoiding the explicit analog circuitries such as the continuous time PFD, the charge pump and the capacitor. Also, any non-linearity appearing in the multi-bit TDC 52 will be linearized through the sigma-delta loop formed by the derivative path. Thus, a simple TDC that does not require high precision accuracy can be used.

The digital PLL implementation with the integration-mode PFD realizes controllable and reliable system dynamic with superior phase noise performance compared to existing digital PLLs while avoiding system sensitivity and non-linearity.

Figure 2:
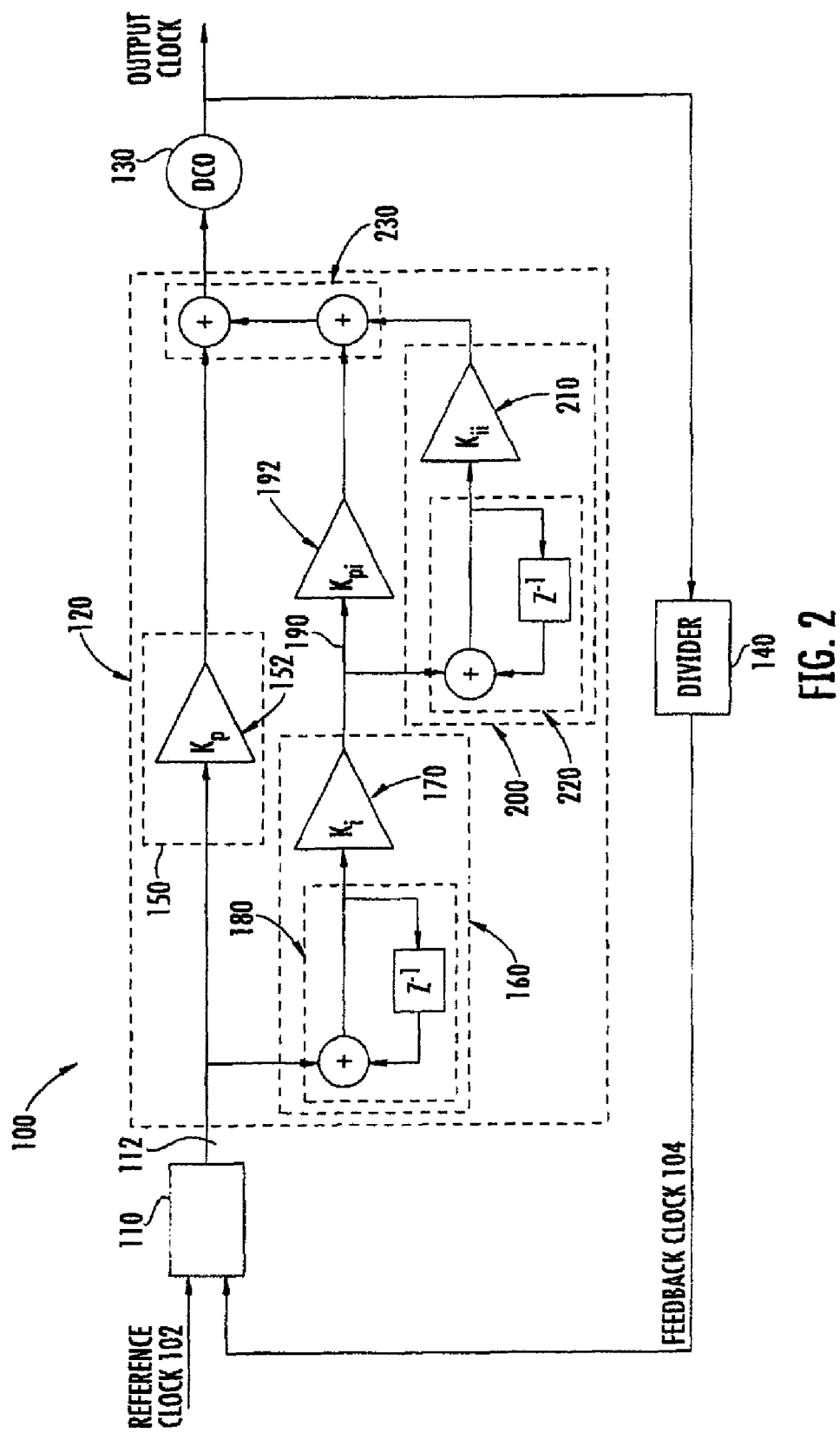
FIG. 2 illustrates an example digital phase and frequency detector (e.g., BBPFD) based all-digital phase-locked loop (AD-PLL) apparatus in accordance with one embodiment.

However, the integration-mode PFD still requires partial analog circuits such as the continuous time PFD 42, the charge-pump 44 and the capacitor 46 for the hybrid implementation 40, or multi-bit TDC 52 in the substantially digital or at least digital-friendly implementation. One embodiment of the digital PLL realization is shown in FIG. 2. The digital PLL shown in FIG. 2 takes the integrator out of the integration-mode PFD 10 and puts it in the loop filter. The modification doesn't require analog circuitries, but provides an equivalent system transfer function dynamics with its modified digital loop filter 120 compared with FIG. 1A, though it gives up the in-band phase noise rejection. The digital PLL architecture shown in FIG. 2 enables fully digital implementation and reduces or eliminates process sensitivity issues.

FIG. 2 illustrates an example digital phase and frequency detector (PFD) based all-digital phase-locked loop (AD-PLL) apparatus with closed-loop linearization technique in accordance with one embodiment. The PFD may be a Bang-Bang phase and frequency detector (BBPFD) or a binary PFD or a lead-lag PFD. In one embodiment, the BBPFD based AD-PLL apparatus 100 includes a BBPFD 110, a digital loop filter (DLF) 120, a digitally controlled oscillator (DCO) 130, and a divider 140. The DLF 120 includes a proportional path 150 having a gain unit 152 (Kp), an integral path 160 having a gain unit (Ki) 170 and a digital integrator 180 (aka accumulator), a proportional-integral path 190 having a gain unit 192 (Kpi), an integral-integral path 200 with gain unit (Kii) 210 and a digital integrator 220, and a digital adder 230.

The BBPFD 110 compares the phase and frequency of a feedback clock 104 to a reference clock 102. The feedback clock 104 is the signal from the DCO 130 divided by the divider 140. The BBPFD 110 generates a single bit indicator that forms an output signal indicating whether the feedback signal leads the reference signal or the reference signal leads the feedback signal based on a comparison of the feedback clock signal 104 and the reference clock 102. The DLF 120 produces a control word for the DCO 130 based on the output signal 112 of the BBPFD 110.

Figure 3A:
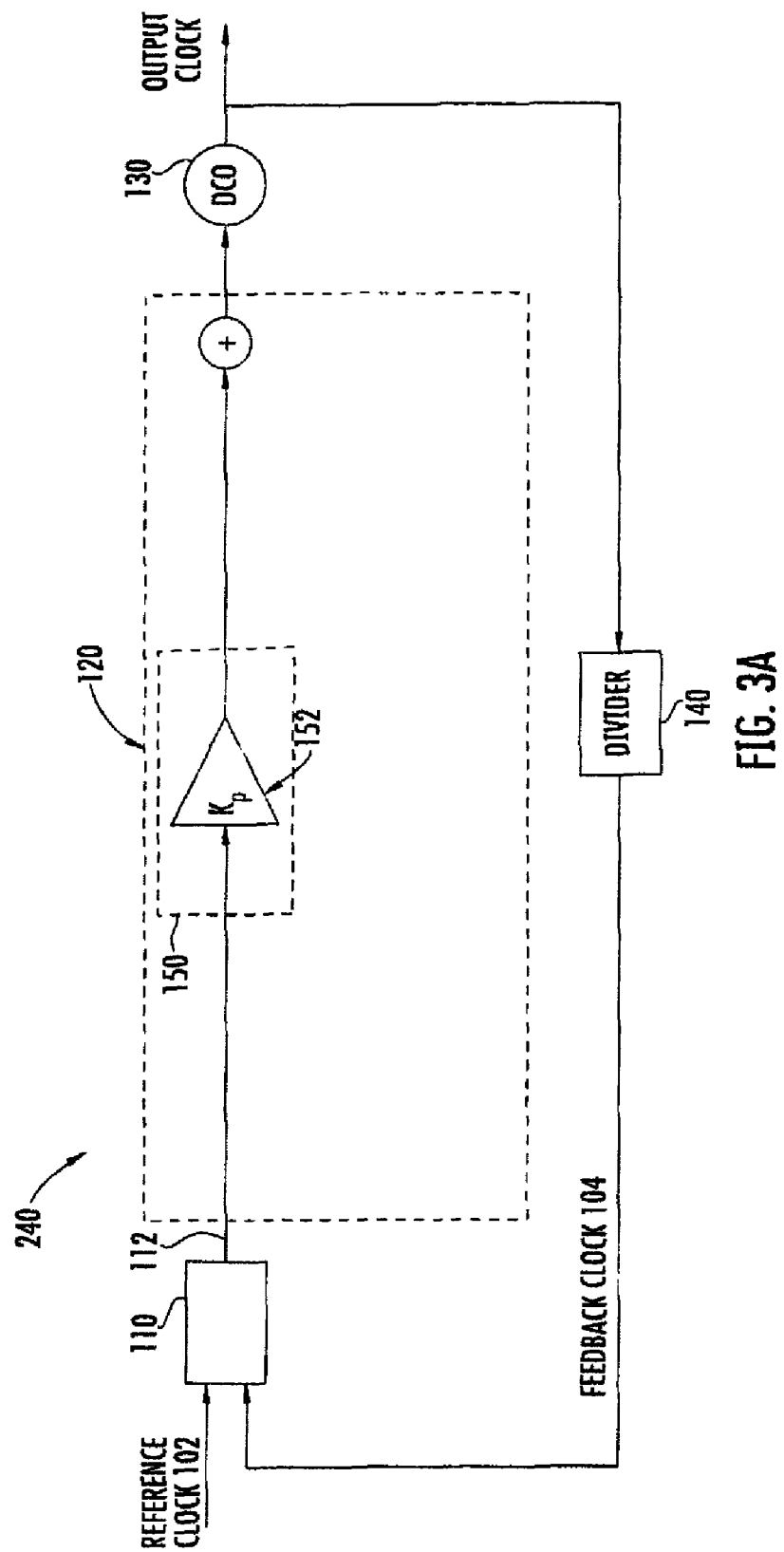
FIG. 3A illustrates a linearization loop of an example digital phase and frequency detector (e.g., BBPFD) based all-digital phase-locked loop (AD-PLL) apparatus in accordance with one embodiment.
Figure 3B:
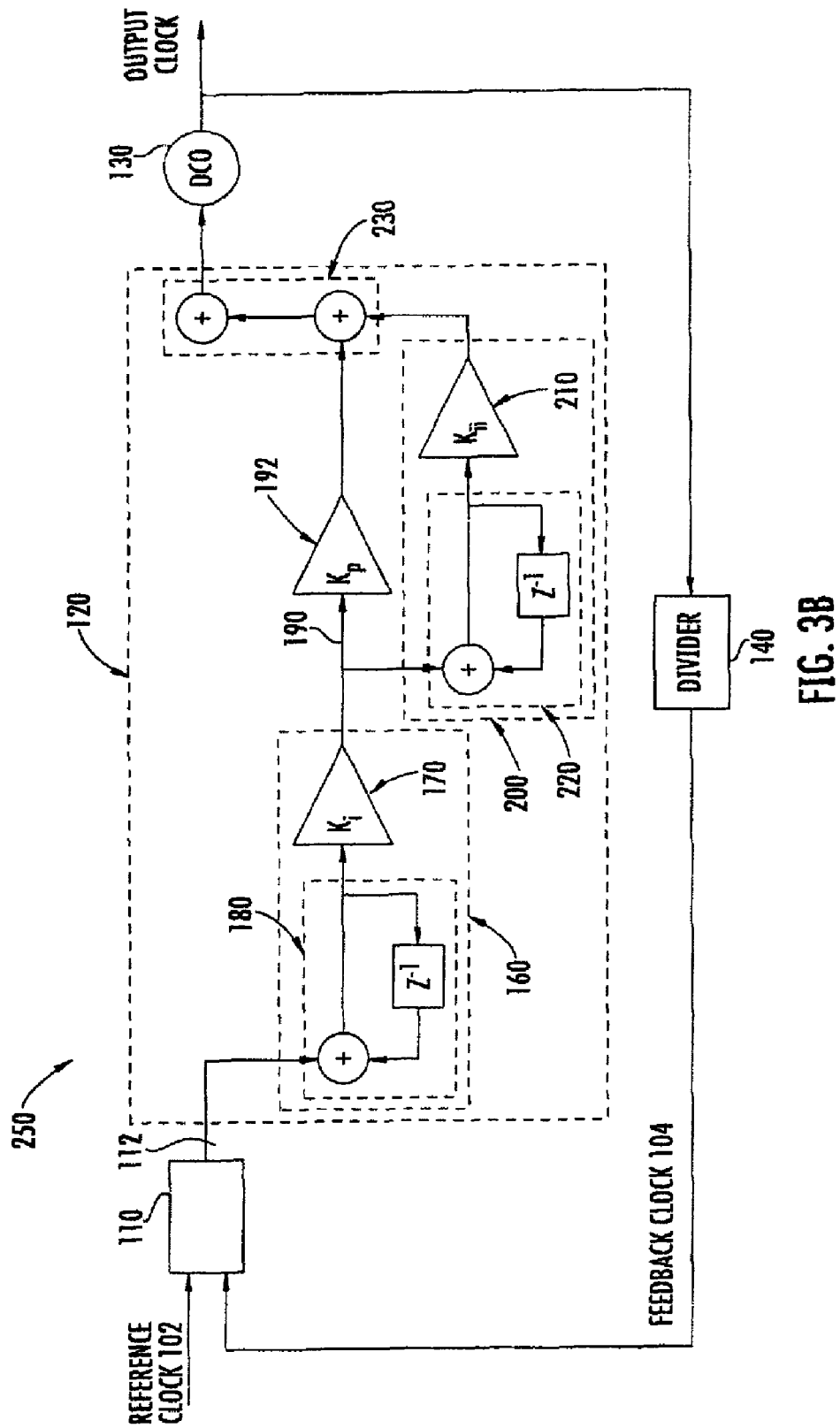
FIG. 3B illustrates a dynamic loop of an example digital phase and frequency detector (e.g., BBPFD) based all-digital phase-locked loop (AD-PLL) apparatus in accordance with one embodiment.

The DLF 120 includes two major functional paths. One is the linearization path including the proportional path 150 and the other is the actual loop dynamic path, which includes the integral path 160, the proportional-integral path 190, and the integral-integral path 200. Therefore, the AD-PLL apparatus 100 includes two independent closed-loops. A linearization loop 240 includes the BBPFD 110, the proportional path 150, the DCO 130, and the divider 140 as illustrated in FIG. 3A. A dynamic closed-loop 250 includes the BBPFD 110, the integral path 160, the proportional-integral path 190, the integral-integral path 200, and the DCO 130, and the divider 140 as illustrated in FIG. 3B.

The proportional path 150 applies the linear constant gain (Kp) to the BBPFD output signal 112, thus the BBPFD output signal 112, which is either '+1' or '−1', becomes '+Kp' or '−Kp' after the proportional path 150. The linearization loop 240 including the proportional path 150 linearizes the highly non-linear BBPFD by producing a sigma-delta modulation-like operation.

The integral path 160 accumulates the BBPFD output signal 112 and applies the linear constant gain (Ki) of gain unit 170. The integral path 160 feeds its output to the proportional-integral path 190 and to the integral-integral path 200. The proportional-integral path 190 applies a constant linear gain (Kpi) of gain unit 192, and the operation corrects an instantaneous phase error.

The integral-integral path 200 accumulates the output of the integral path 160 and applies a constant linear gain (Kii) of gain unit 210. The operation of the integral-integral path is to track long-term phase error, therefore it corrects any frequency error. The proportional path 150 output, the proportional-integral path 190 output, and the integral-integral path 200 output are combined together by the digital adder 230 to produce a control word for the DCO 130. The DCO 130 adjusts its frequency based on the control word fed by the DLF 120. The amount of the DCO frequency change per least significant bit (LSB) of the control word is defined as a DCO frequency gain (Kdco), which corresponds to the amount of frequency change in Hz at the output of the DCO 130 per LSB of the control word produced by the DLF 120. The unit of the Kdco is Hz/LSB.

Figure 4:
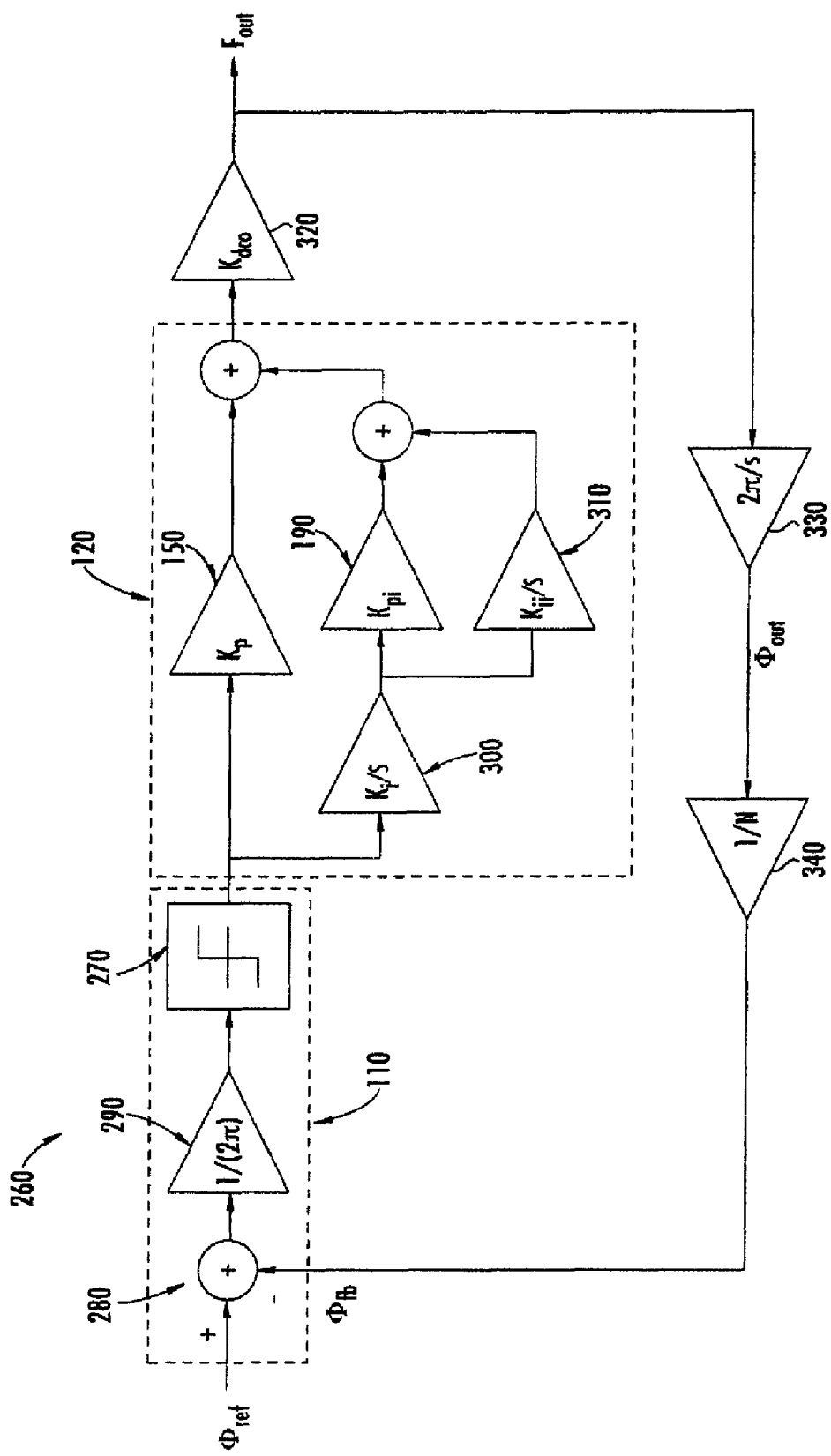
FIG. 4 illustrates an equivalent linear model 260 of the AD-PLL 100 in phase domain in accordance with one embodiment.

FIGS. 4 through 7 illustrate the linearization process of linearization loop 240 in accordance with one embodiment. FIG. 4 represents an equivalent linear model 260 of the AD-PLL apparatus 100 in phase domain. The BBPFD 110 is modeled as a non-linear hard decision block 270 preceded by a phase-subtractor 280 and a gain-normalization 290 with gain of 1/(2π). The gain-normalization 290 normalizes the phase error produced by the phase-subtractor 280 within a −1 to 1 period of clock range in a similar manner as a traditional analog PFD.

The integral path 160 is modeled as a linear gain-integrator block 300, and the gain Ki is normalized by the operating clock frequency. The integral-integral path 200 is modeled as a linear gain-integrator 310, and the gain Kii is normalized by the operating clock frequency. The DCO 130 is modeled as a linear gain block 320 with the gain of Kdco in cascade with 330 (note that both these block are needed to represent the DCO). The divider 140 is modeled as a linear divider 340 with division ratio of N. $Ø_{ref}$ and $Ø_{fb}$ represent the reference clock phase and the feedback clock phase, respectively.

Figure 5:
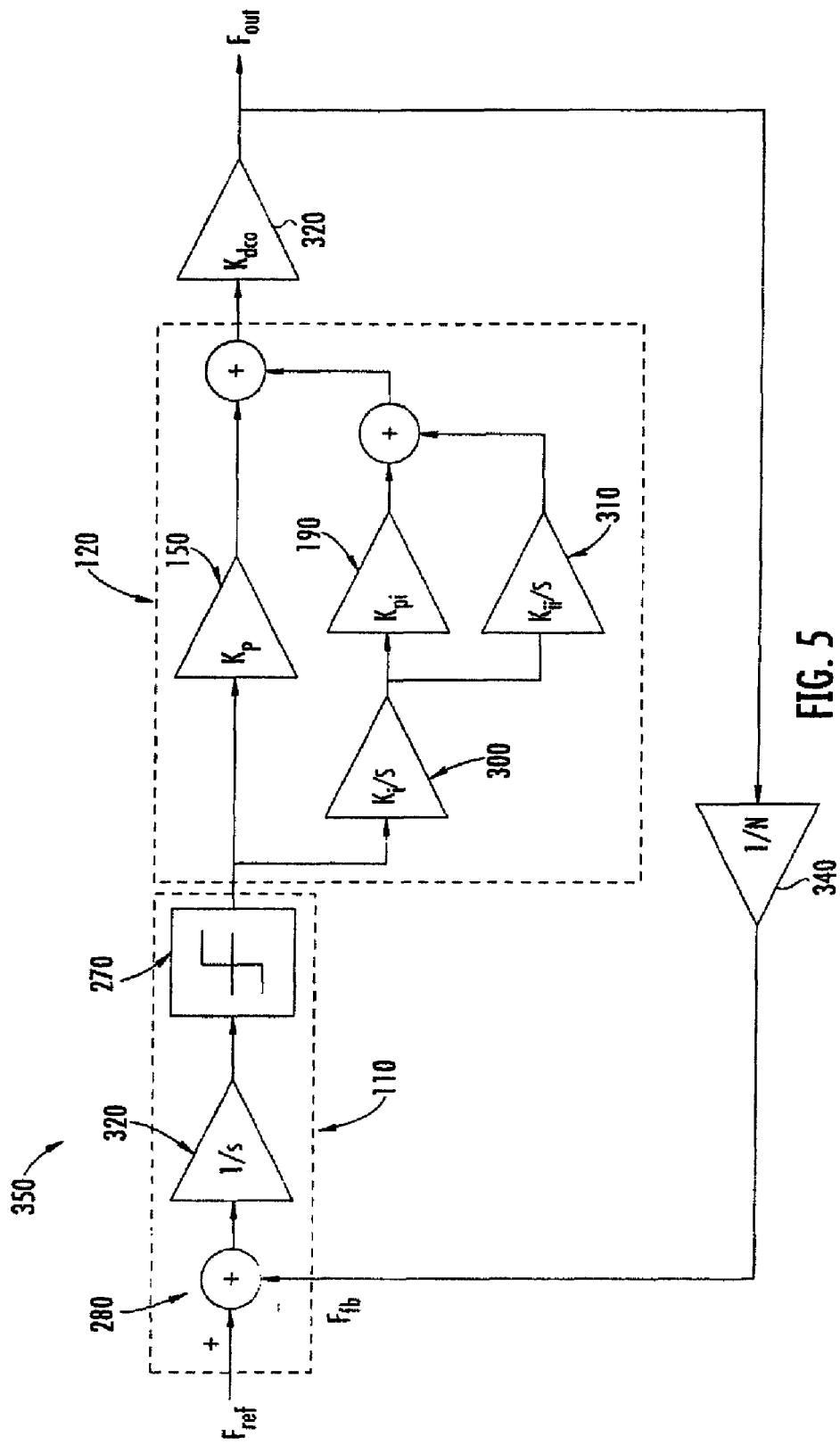
FIG. 5 illustrates a frequency-domain expression of the phase domain linear model in accordance with one embodiment.

FIG. 5 depicts a frequency-domain expression 350 of the phase domain linear model 260. The gain-integrator block 330 is relocated before the hard decision block 270 by moving it across linear blocks; the divider model 340 and the phase-subtractor 280. The gain of 2π in the gain-integrator block 330 is compensated by the gain-normalization 290. However, it is not allowed to move any linear operation across any non-linear blocks, such as the hard decision 270, according to linear system theory. $F_{ref}$ and $F_{fb}$ represent the reference clock frequency and the feedback clock frequency, respectively. This process of sub-block rearrangement does not change the PLL input clock phase to output clock phase transfer function.

Figure 6:
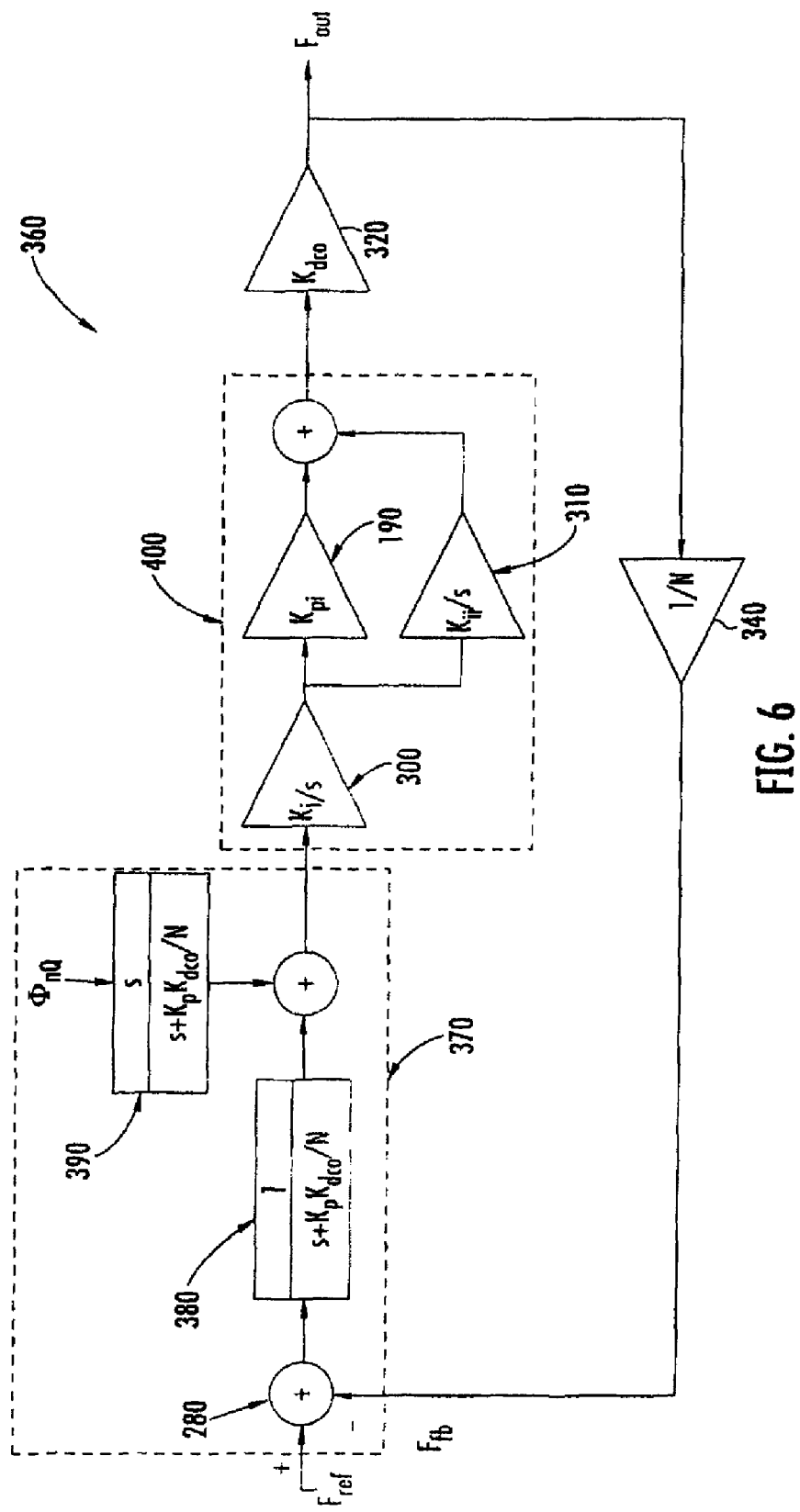
FIG. 6 illustrates a linearized frequency-domain AD-PLL model in accordance with one embodiment.
Figure 7:
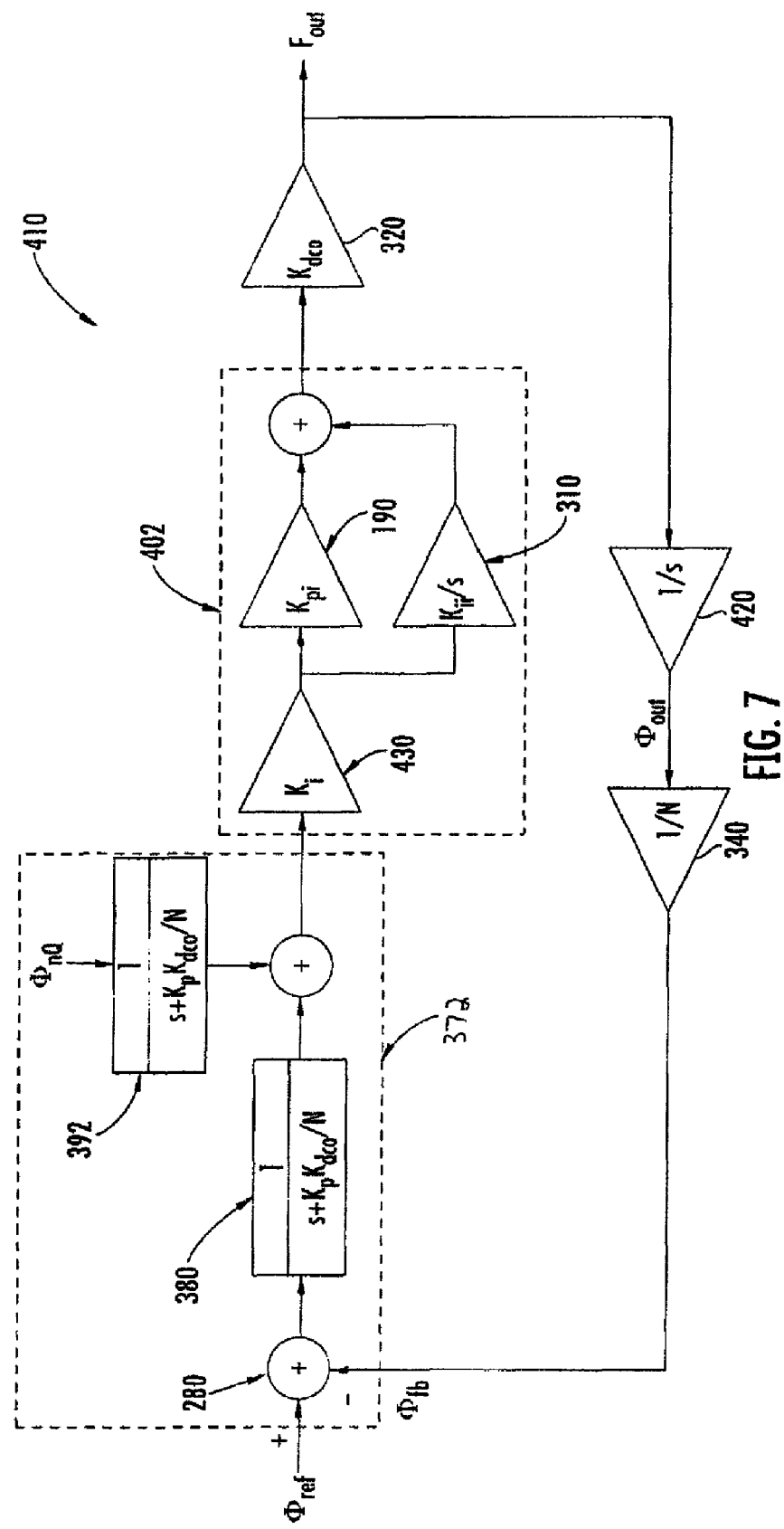
FIG. 7 illustrates a linearized phase-domain AD-PLL model 410 in accordance with one embodiment.

Note that FIG. 5 describes a frequency locked loop. By assuming that the hard-decision block 270 is a quantization noise inducer, such that the output of the hard-decision block 270 includes the phase error in addition to quantization noise produced by the hard-decision 270, the linearization loop 240 in FIG. 2 can be approximated as a linearized BBPFD 370 including an equivalent linear BBPFD transfer function 380 and a noise shaping function 390 to the quantization noise as shown in FIG. 6, which illustrates a fully linearized frequency-domain AD-PLL model 360. After this linearization transformation, the DLF 120 gets reformed to a Dynamic DLF (DDLF) 400, which excludes the proportional path 150 and includes only the dynamic loop 250 parts. A $Ø_{nQ}$ input to 390 represents the phase-domain quantization noise produced by the BBPFD 110. Since the linearized BBPFD 370 is a linear function, it is allowed to move the integrator in the linear gain-integrator block 300 across the linearized BBPFD 370, and as a result, the reference frequency (Fref) and the feedback frequency ($F_{fb}$) are converted back to the reference phase (Øref) and the feedback phase ($Ø_{fb}$) as shown in FIG. 7, which illustrates a linearized phase-domain AD-PLL model 410. Note that the system in FIG. 7 now describes a Phase Locked Loop and not a Frequency Locked Loop. A linearized BBPFD 372 includes the equivalent linear BBPFD transfer function 380 and a noise shaping function 392. The linearized BBPFD 372 is coupled to the DDLF 402. The integrator 420 after the linear DCO model 320 comes from the integrator in the gain-integrator block 300 in FIG. 6, thus the gain-integrator becomes a linear gain block 430. The linearization process implies that the output of the first integral path 160 in FIG. 1 is the actual phase error as converting the frequency error from the BBPFD 110 by the integration.

Figure 8:
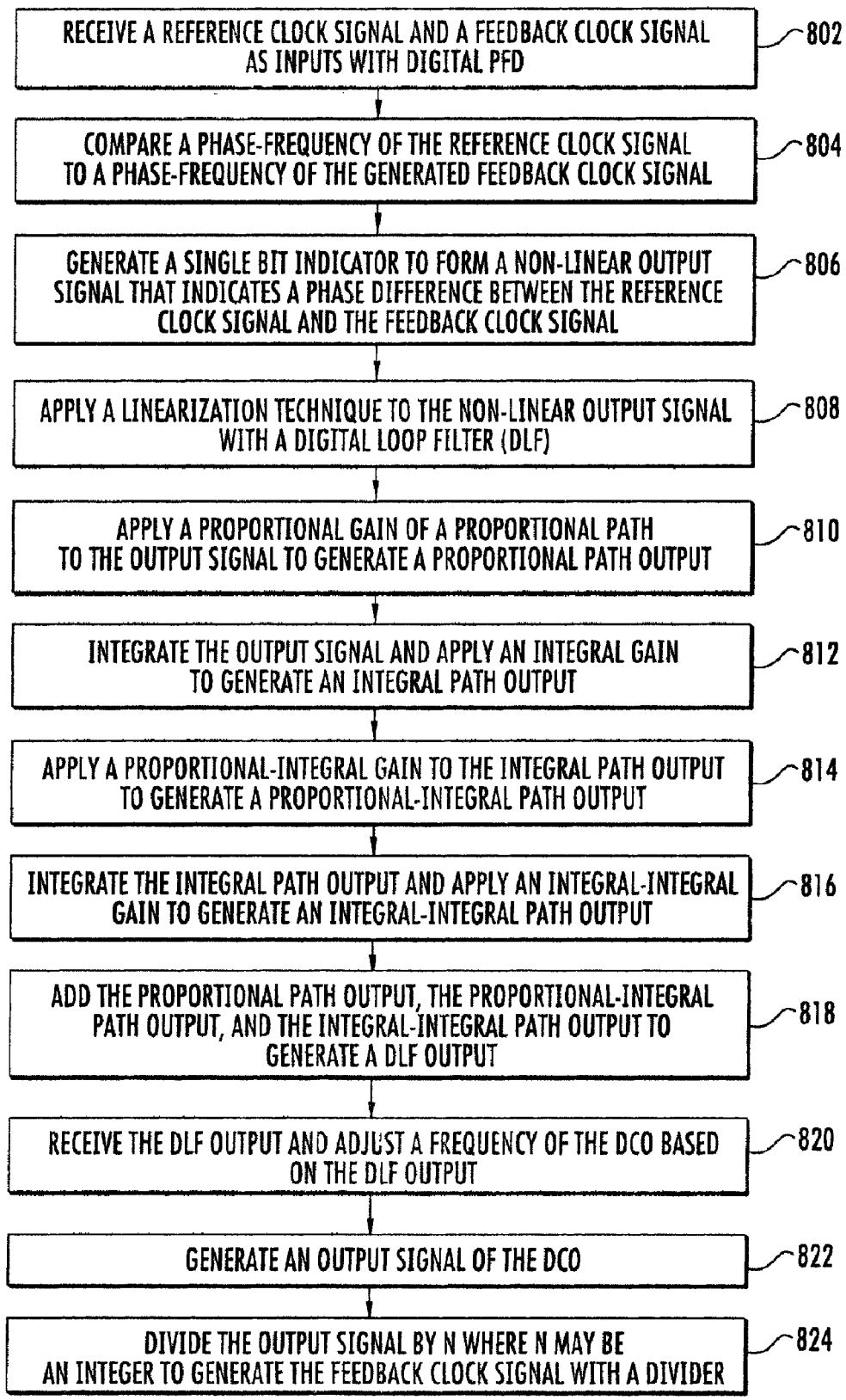
FIG. 8 shows a flow chart for a method to operate an example digital phase and frequency detector (PFD) based all-digital phase-locked loop (AD-PLL) with closed-loop linearization technique in accordance with one embodiment.

FIG. 8 shows a flow chart for a method to operate an example digital phase and frequency detector (PFD) based all-digital phase-locked loop (AD-PLL) with closed-loop linearization technique in accordance with one embodiment. The PFD may be a Bang-Bang phase and frequency detector (BBPFD) or a binary PFD or a lead-lag PFD. In one embodiment, the digital PFD (e.g., BBPFD) receives a reference clock signal and a feedback clock signal as inputs at block 802. The PFD compares a phase and frequency of the reference clock signal to a phase and frequency of the generated feedback clock signal at block 804. The PFD generates a single bit indicator to form a digitized output signal that indicates a phase difference between the reference clock signal and the feedback clock signal at block 806. A digital loop filter (DLF) applies a linearization technique to the digitized output signal at block 808. The linearization technique includes applying a proportional gain of a proportional path to the output signal to generate a proportional path output at block 810. Then, the linearization technique integrates the output signal and applies an integral gain to generate an integral path output at block 812. The linearization technique applies a proportional-integral gain to the integral path output to generate a proportional-integral path output at block 814. The linearization technique integrates the integral path output and applies an integral-integral gain to generate an integral-integral path output at block 816. The linearization technique adds the proportional path output, the proportional-integral path output, and the integral-integral path output to generate a DLF output at block 818.

The digitally controlled oscillator (DCO) receives the DLF output and adjusts a frequency of the DCO based on the DLF output at block 820. The DCO generates an output signal at block 822. The divider divides the output signal by N where N may be an integer to generate the feedback clock signal at block 824.

Figure 9:
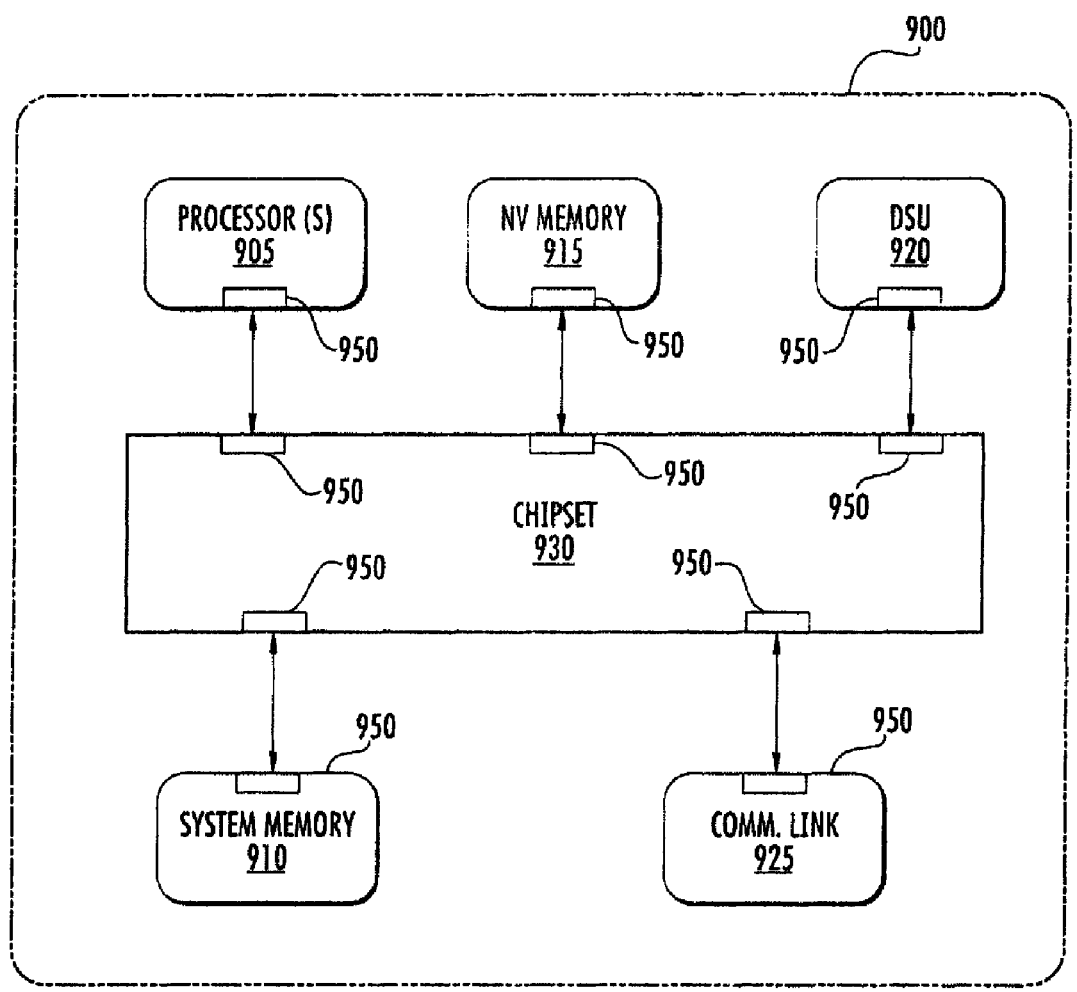
FIG. 9 illustrates a functional block diagram illustrating a demonstrative system 900 implemented in accordance with an embodiment.

FIG. 9 illustrates a functional block diagram illustrating a demonstrative system 900 implemented in accordance with an embodiment. The illustrated embodiment of processing system 900 includes one or more processors (or central processing units) 905, system memory 910, nonvolatile ("NV") memory 915, a data storage unit ("DSU") 920, a communication link 925, and a chipset 930. The illustrated processing system 900 may represent any computing system including a desktop computer, a notebook computer, a workstation, a handheld computer, a server, a blade server, or the like.

The elements of processing system 900 are interconnected as follows. Processor(s) 905 is communicatively coupled to system memory 910, NV memory 915, DSU 920, and communication link 925, via chipset 930 to send and to receive instructions or data thereto/therefrom. In one embodiment, NV memory 915 is a flash memory device. In other embodiments, NV memory 915 includes any one of read only memory ("ROM"), programmable ROM, erasable programmable ROM, electrically erasable programmable ROM, or the like. In one embodiment, system memory 910 includes random access memory ("RAM"), such as dynamic RAM ("DRAM"), synchronous DRAM, ("SDRAM"), double data rate SDRAM ("DDR SDRAM"), static RAM ("SRAM"), and the like. DSU 920 represents any storage device for software data, applications, and/or operating systems, but will most typically be a nonvolatile storage device. DSU 920 may optionally include one or more of an integrated drive electronic ("IDE") hard disk, an enhanced IDE ("EIDE") hard disk, a redundant array of independent disks ("RAID"), a small computer system interface ("SCSI") hard disk, and the like. Although DSU 920 is illustrated as internal to processing system 900, DSU 920 may be externally coupled to processing system 900. Communication link 925 may couple processing system 900 to a network such that processing system 900 may communicate over the network with one or more other computers. Communication link 925 may include a modem, an Ethernet card, a Gigabit Ethernet card, Universal Serial Bus ("USB") port, a wireless network interface card, a fiber optic interface, or the like.

As illustrated in FIG. 9, each of the subcomponents of processing system 900 includes input/output ("I/O") circuitry 950 for communication with each other. I/O circuitry 950 may include impedance matching circuitry that may be adjusted to achieve a desired input impedance thereby reducing signal reflections and interference between the subcomponents. In one embodiment, AD-PLL 100 may be included within I/O circuitry 950 to provide a robust data clock source. In another embodiment, AD-PLL 100 may be included within various digital systems. For example, the AD-PLL 100 may be included within the processor(s) 905 to provide a flexible core clock source.

It should be appreciated that various other elements of processing system 900 have been excluded from FIG. 9 and this discussion for the purposes of clarity. For example, processing system 900 may further include a graphics card, additional DSUs, other persistent data storage devices, and the like. Chipset 930 may also include a system bus and various other data buses for interconnecting subcomponents, such as a memory controller hub and an input/output ("I/O") controller hub, as well as, include data buses (e.g., peripheral component interconnect bus) for connecting peripheral devices to chipset 930. Correspondingly, processing system 900 may operate without one or more of the elements illustrated. For example, processing system 900 need not include DSU 920.

Embodiments of the invention implicitly linearize the BBPFD with a separate proportional path in a digital loop filter. The closed-loop form of the proportional path realizes a sigma-delta modulation analogue along with the BBPFD and the DCO, and hence the linearization technique provides a first degree quantization noise shaping while providing a linearization for the BBPFD. The first degree quantization noise shaping improves in-band phase noise performance without using a high-resolution TDC. Therefore, embodiments of the invention achieve linearity, simplicity, robustness, and high performance phase noise (i.e. low phase noise).

Embodiments of the invention include an implicit sigma-delta linearization loop with a separate proportional path and a frequency error to phase error conversion by a single integrator before a digital loop filter, which is the major loop filter controlling the PLL system dynamics.

Embodiments of the invention realize a fully digital PLL that operates robustly over a wide frequency range and provides maximum flexibility for various applications. Existing PLLs on various products are analog and more sensitive to the manufacturing process. These existing PLLs require customized physical adjustments of the loop filter based upon applications and specifications that often limit the product development cycle. Thus, embodiments of this invention can enable technology extension through reduced reliance on analog performance and agile product development.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, or other type of machine-readable media suitable for storing electronic instructions.

It should be appreciated that reference throughout this specification to "one embodiment" or "an embodiment" means that a particular feature, structure or characteristic described in connection with the embodiment is included in at least one embodiment. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments.

In the above detailed description of various embodiments, reference is made to the accompanying drawings, which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in to the art to practice the teachings disclosed herein. Other embodiments may be utilized and derived there from, such that structural and logical substitutions and changes may be made without departing from the scope of this disclosure. The following detailed description, therefore, is not to be taken in a limiting sense, and the scope of various embodiments is defined only by the appended claims, along with the full range of equivalents to which such claims are entitled.

What is claimed is:

1. An apparatus, comprising:
a digital phase frequency detector (PFD) to receive a reference clock signal as input, to compare a phase and frequency of the reference clock signal to a phase and frequency of a generated feedback clock signal, and to generate a digitized output signal;

a digital loop filter (DLF) to receive the digitized output signal and to apply a linearization technique to the digitized output signal, wherein the DLF comprises:
a proportional gain unit of a proportional path, the proportional gain unit coupled to the digital PFD;
an integral gain unit coupled to a first digital integrator to form an integral path;
a proportional-integral gain unit of a proportional-integral path, the proportional integral gain unit coupled to the integral gain unit; and
an integral-integral gain unit coupled to a second digital integrator to form an integral-integral path.

2. The apparatus of claim 1, wherein the apparatus is an all-digital phase-locked loop (ADPLL) apparatus that further comprises:
a digitally controlled oscillator (DCO) to receive a control word from the DLF in order to generate an output signal; and
a divider to receive the output signal and to generate the feedback clock signal.

3. The apparatus of claim 2, wherein the digital PFD comprises a bang-bang PFD (BBPFD) to generate a single bit indicator that forms the digitized output signal.

4. The apparatus of claim 3, wherein the BBPFD, the proportional path, the DCO, and the divider in combination form a linearization closed-loop.

5. The apparatus of claim 3, wherein the BBPFD, the integral path, the proportional-integral path, integral-integral path, the DCO, and the divider form a dynamic closed-loop.

6. The apparatus of claim 4, wherein the linearization closed-loop to linearize the highly non-linear BBPFD by producing a sigma-delta modulation-like operation.

7. The apparatus of claim 2, wherein the ADPLL apparatus to exclude the use of time-to-digital converter circuitry and also to exclude any dependencies of analog characteristics.

8. The apparatus of claim 1, wherein the linearization technique to push quantization noise of the digital PFD into a high frequency range.

9. A method, comprising:
generating an indicator with a digital phase frequency detector (PFD) to form a digitized output signal that indicates a phase difference between a reference clock signal and a feedback clock signal;
applying a linearization technique to the digitized output signal with a digital loop filter (DLF), wherein the linearization technique comprises:
applying a proportional gain of a proportional path to the output signal to generate a proportional path output;
integrating the output signal and applying an integral gain to generate an integral path output;
applying a proportional-integral gain to the integral path output to generate a proportional-integral path output;
integrating the integral path output and applying an integral-integral gain to generate an integral-integral path output; and
adding the proportional path output, the proportional-integral path output, and the integral-integral path output to generate a DLF output.

10. The method of claim 9, further comprising:
receiving the DLF output as an input for a digitally controlled oscillator (DCO);
adjusting a frequency of the DCO based on the input;
generating an output signal from the DCO.

11. The method of claim 9, further comprising:
receive the output signal with a divider; and
generating the feedback clock signal.

12. The method of claim 9, wherein the digital PFD is a bang-bang PFD (BBPFD).

13. The method of claim 11, wherein the BBPFD, DLF, DCO, and divider in combination form an all-digital phase-locked loop (ADPLL) apparatus.

14. The method of claim 9, further comprising:
receiving the reference clock signal and the feedback clock signal as inputs to the digital PFD; and
comparing a phase and frequency of the reference clock signal to a phase and frequency of the generated feedback clock signal with the digital PFD.

15. The method of claim 9, wherein the linearization technique to linearize the highly non-linear PFD by producing a sigma-delta modulation-like operation.

* * * * *